(12) United States Patent
Plank et al.

(10) Patent No.: US 12,176,331 B2
(45) Date of Patent: Dec. 24, 2024

(54) ELECTRONIC DEVICE

(71) Applicant: Infineon Technologies AG, Neubiberg (DE)

(72) Inventors: Hannes Plank, Graz (AT); Markus Dielacher, Graz (AT); Martin Flatscher, Graz (AT); Heinrich Guenther Heiss, Munich (DE); Robert Lobnik, Bad Eisenkappel (AT); Armin Josef Schoenlieb, Seiersberg-Pirka (AT)

(73) Assignee: Infineon Technologies AG, Neubiberg (DE)

( * ) Notice: Subject to any disclaimer, the term of this patent is extended or adjusted under 35 U.S.C. 154(b) by 483 days.

(21) Appl. No.: 17/524,286

(22) Filed: Nov. 11, 2021

(65) Prior Publication Data

US 2022/0149025 A1 May 12, 2022

(30) Foreign Application Priority Data

Nov. 12, 2020 (EP) .................................... 20207109

(51) Int. Cl.
H01L 25/16 (2023.01)
(52) U.S. Cl.
CPC .................. *H01L 25/167* (2013.01)
(58) Field of Classification Search
CPC .................................................. H01L 25/167
See application file for complete search history.

(56) References Cited

U.S. PATENT DOCUMENTS

| 11,343,419 | B2 | 5/2022 | Liao | |
|---|---|---|---|---|
| 2008/0175603 | A1 | 7/2008 | Son et al. | |
| 2010/0060569 | A1 | 3/2010 | Shamilian | |
| 2012/0134549 | A1* | 5/2012 | Benkley, III | G01N 27/04 324/649 |
| 2012/0146953 | A1* | 6/2012 | Yi | G06F 3/042 345/175 |
| 2013/0135328 | A1 | 5/2013 | Rappoport et al. | |
| 2015/0201130 | A1 | 7/2015 | Cho et al. | |

(Continued)

FOREIGN PATENT DOCUMENTS

| CN | 109141485 A | 1/2019 |
|---|---|---|
| CN | 110491909 A | 11/2019 |

(Continued)

*Primary Examiner* — Ariel A Balaoing
(74) *Attorney, Agent, or Firm* — Murphy, Bilak & Homiller, PLLC

(57) ABSTRACT

An electronic device is provided. The electronic device includes a display device configured to display an optical image on a front side of the display device. Further, the electronic device includes at least one sensor configured to measure electromagnetic radiation received from a scene in front of the front side of the display device. The display device includes a first display region using a first display technology and exhibiting a first transmissivity for the electromagnetic radiation. The display device further includes a second display region using a second display technology and exhibiting a second transmissivity for the electromagnetic radiation. The first transmissivity is higher than the second transmissivity. The at least one sensor is arranged on a back side of the display device and faces the first display region.

19 Claims, 2 Drawing Sheets

(56) References Cited

U.S. PATENT DOCUMENTS

| | | | |
|---|---|---|---|
| 2017/0179092 A1* | 6/2017 | Sasaki | H10K 59/70 |
| 2018/0059481 A1 | 3/2018 | Dunne | |
| 2018/0096187 A1* | 4/2018 | Kwon | H04M 1/026 |
| 2018/0267362 A1 | 9/2018 | Gahagan et al. | |
| 2019/0006438 A1 | 1/2019 | Wu et al. | |
| 2019/0130822 A1* | 5/2019 | Jung | G09G 3/2003 |
| 2019/0280058 A1 | 9/2019 | Li | |
| 2020/0312831 A1* | 10/2020 | He | H01L 25/18 |
| 2020/0312925 A1* | 10/2020 | Xia | H01L 25/167 |
| 2022/0163854 A1* | 5/2022 | Mochizuki | G03B 11/045 |

FOREIGN PATENT DOCUMENTS

| | | |
|---|---|---|
| CN | 107767835 B | 4/2020 |
| EP | 3537255 A1 | 9/2019 |
| JP | 2008304523 A | 12/2008 |

* cited by examiner

ELECTRONIC DEVICE

TECHNICAL FIELD

The present disclosure relates to an electronic device.

BACKGROUND

Displays of devices like smartphones tend to occupy the complete front side of the device such that optical sensors are located under the display. The transparency of conventional displays is limited. As the light needs to pass the display, the optical sensors suffer from this trend. Current display technologies need to sacrifice display quality (e.g. brightness and/or resolution) for increased display transparency.

Hence, there may be a demand for improved light guidance through displays.

SUMMARY

The demand may be satisfied by the subject matter of the appended claims.

An example relates to an electronic device. The electronic device comprises a display device configured to display an optical image on a front side of the display device. Further, the electronic device comprises at least one sensor configured to measure electromagnetic radiation received from a scene in front of the front side of the display device. The display device comprises a first display region using a first display technology and exhibiting a first transmissivity for the electromagnetic radiation. The display device further comprises a second display region using a second display technology and exhibiting a second transmissivity for the electromagnetic radiation. The first transmissivity is higher than the second transmissivity. The at least one sensor is arranged on a back side of the display device and faces the first display region.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
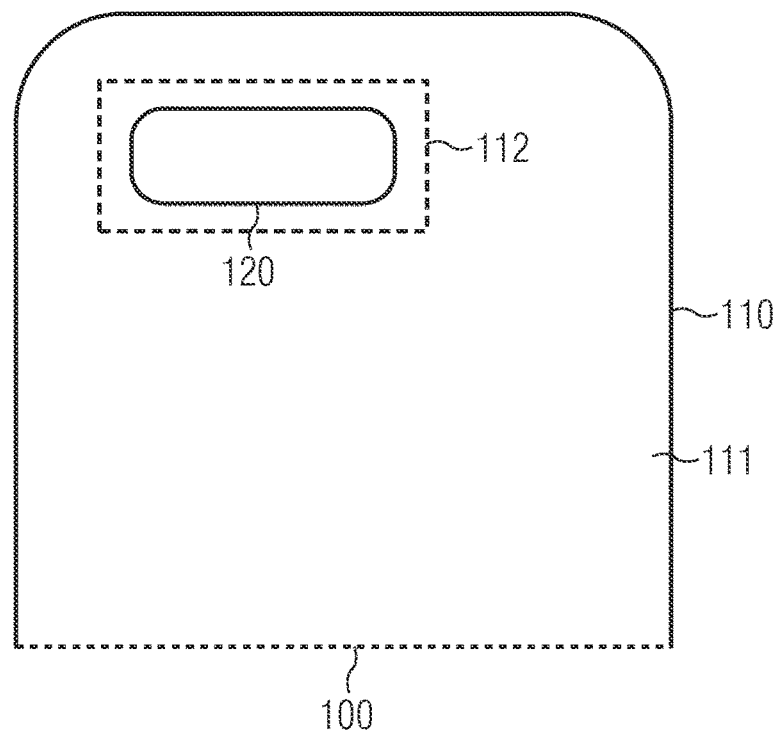
FIG. 1 illustrates an example of an electronic device.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates part of an electronic device 100 such as, e.g., a smartphone, a tablet-computer or a laptop-computer. However, it is to be noted that the electronic device 100 may be any other electronic device as well.

The electronic device 100 comprises a display device 110 configured to display an optical image on a front side of the display device 110. The front side 113 of the display device 110 is the side of the display device 110 that can be seen by a user of the electronic device 100. The display device 110 may cover (substantially) the entire front surface of the electronic device 100 as illustrated in FIG. 1. In other examples, the display device 110 may cover only a fraction of the electronic device 100's front surface.

Further, the electronic device 100 comprises at least one sensor 120 configured to measure electromagnetic radiation received from a scene in front of the front side of the display device 110. In the example of FIG. 1, one sensor 120 is illustrated. However, the electronic device 100 may optionally comprise plural sensors. The at least one sensor 120 is arranged within the electronic device 100 at a back side of the display device 110. In other words, the display device 110 is arranged between the at least one sensor 120 and the scene. As a consequence, the electromagnetic radiation from the scene needs to transmit through the display device 110 in order to reach the sensor 120. In general, the at least one sensor 120 may be configured to measure any type of electromagnetic radiation. For example, the at least one sensor 120 may be configured to measure light or radio waves.

The display device 110 comprises a first display region 111 using a first display technology. The display device 110 further comprises a second display region 112 using a second display technology. In other words, the first display region 111 and the second display region 112 are based on different display technologies.

The first display region 111 exhibits a first transmissivity for the electromagnetic radiation. The second display region 112 exhibits a second transmissivity for the electromagnetic radiation. The first transmissivity is higher than the second transmissivity.

The at least one sensor 120 faces the first display region 111 with increased transparency for the electromagnetic radiation. In other words, the at least one sensor 120 is arranged on the back side of the display device 110 at a position of the first display region 111.

As the at least one sensor 120 is arranged behind the first display region 111 with increased transparency for the electromagnetic radiation, a higher fraction of the electromagnetic radiation from the scene can reach the at least one sensor 120 compared to an arrangement of the sensor behind the second display region 112. As a consequence, impairment of the at least one sensor 120 by the display device 110 may be significantly reduced compared to conventional display structure for under-display sensors.

In order to achieve the increased transparency for the electromagnetic radiation in the first display region 111, a substrate (not illustrated) of the display device 110 may, e.g., be covered in the first display region 111 per unit area to a lesser extent with electronic circuitry of the display device 110 than in the second display region 112. For example, less electronic circuitry of the display device may be arranged in the first display region 111 compared to the second display region 112. Alternatively or additionally, electronic circuitry of a smaller form factor may be arranged in the first display region 111 compared to the second display region 112. For example, the second display region 112 may be based on a Light Emitting Diode (LED) display technology, an Organic LED (OLED) display technology or a Liquid Crystal Display (LCD) technology. The first display region 111 may, e.g., be based on a micro LED display technology. In other words, the first display technology may use micro LEDs, whereas the second display technology may use OLEDs. As micro LEDs are smaller in size than OLEDs, the substrate of the display device 110 is covered in the first display region 111 per unit area to a lesser extent with LEDs than in the second display region 112.

Speaking more general, the first display region 111 comprises a plurality of first light-emitting elements for displaying a first part of the optical image on the front side of the display device 110, and the second display region 112 comprises a plurality of second light-emitting elements for displaying a second part of the optical image on the front side of the display device 110. The first light-emitting elements are of smaller individual size than the second light-emitting elements. Each of the first light-emitting elements may, e.g., comprise at least one respective micro LED, and each of the second light-emitting elements may, e.g., comprise at least one respective OLED. For example, each of the first light-emitting elements may comprise at least three micro LEDs each configured to selectively emit different ones of red light, green light and blue light. Similarly, each of the second light-emitting elements may comprise at least three OLEDs each configured to selectively emit different ones of red light, green light and blue light. Accordingly, distances between neighboring ones of the plurality of second light-emitting elements in the second display region 112 are smaller than distances between neighboring ones of the plurality of first light-emitting elements in the first display region 111. Each of the first and second light-emitting elements may be configured to selectively emit red, green and/or blue light—either directly (e.g. by comprising corresponding micro LEDs or OLEDs for the different light colors) or indirectly (e.g. using one or more light conversion elements for converting the light emitted by one or more micro LEDs or OLEDs to red, green or blue light).

The light-emitting elements (circuitries, devices) in the first display region 111 and the second display region 112 may be arranged in an array as pixels for displaying the optical image. A pixel density of the first display region may be equal to a pixel density of the second display region. In other words, a display resolution of the display device 110 need not be reduced in the first display region 111 compared to the second display region 112 for achieving the increased transparency for the electromagnetic radiation in the first display region 111. In other words, a number of the first light-emitting elements per unit area in the first display region 111 is equal to a number of the second light-emitting elements per unit area in the second display region 112.

If electronic circuitry of a smaller form factor is arranged in the first display region 111 compared to the second display region 112, the pixel density of the first display region may even be greater than to the pixel density of the second display region while still achieving an increased transparency for the electromagnetic radiation in the first display region 111 compared to the second display region 112 (e.g. when using micro LEDs in the first display region 111 and OLEDs in the second display region 112). In other words, the number of the first light-emitting elements per unit area in the first display region 111 may be greater than the number of the second light-emitting elements per unit area in the second display region 112 while still achieving an increased transparency for the electromagnetic radiation in the first display region 111 compared to the second display region 112.

According to examples, the electronic circuitry of the first display region 111 may be formed on a same substrate layer of the display device 110 as the electronic circuitry of the second display region 112 (e.g. in a thin-film transistor layer or another layer of the display device 110). Alternatively, the electronic circuitry of the first display region 111 and the electronic circuitry of the second display region 112 may be formed on different substrate layers of the display device 110 (e.g. in different thin-film transistor layers or different other layers of the display device 110). In other words, the display device 110 may support different display technologies on the same substrate.

At the border between the display technologies, there could be an overlap region featuring both technologies in order to further mitigate a potentially visible edge between the different display technologies. In other words, the display device 110 may optionally comprise an additional third display region (not illustrated) which is formed between the first display region 111 and the second display region 112. As indicated above, the third display region comprises a mixed arrangement of the first light-emitting elements and the second light-emitting elements. For example, micro LEDs forming the first light-emitting elements may be integrated/arranged between OLEDs forming the second light-emitting elements.

As described above, the at least one sensor 120 may be configured to measure light or radio waves. For example, the at least one sensor 120 may be an optical sensor. The optical sensor may, e.g., comprise a Photonic Mixer Device (PMD) or a Charge-Coupled Device (CCD) for measuring the light. For example, the optical sensor may be a Time-of-Flight (ToF) sensor (for direct and/or indirect ToF sensing). Alternatively, the optical sensor may be a light sensor, an optical presence detection sensor, a sensor of an active stereo camera or any other optical (e.g. infrared) camera. Accordingly, the optical sensor may comprise processing circuitry configured to determine, based on the measured light from the scene, at least one of an image of at least part of the scene or a distance of the electronic device 100 to at least one object in the scene. In other examples, the at least one sensor 120 may be one of a radar sensor and a radio frequency receiver for wireless communication.

The electronic device 100 may optionally further comprises at least one emitter (not illustrated) configured to emit the electromagnetic radiation such that the at least one sensor 120 measures the fraction of the emitted electromagnetic radiation that is reflected back from the scene to electronic device 100. For example, the at least one emitter may be arranged on the back side of the display device 110 and face the first display region 111. In other words, the at least one emitter may be arranged on the back side of the display device 110 at a position of the first display region 111. That is, also the at least one emitter may be arranged behind the first display region 111 with increased transparency for the electromagnetic radiation.

As the at least one emitter faces the first display region 111, the electromagnetic radiation passes (substantially) through the first display region 111 with increased transparency such that a higher fraction of the electromagnetic radiation can transmit through the display device 110 into the scene. Accordingly, a power of the electromagnetic radiation may be reduced compared to conventional under-display emitter structures. As a consequence, a power consumption of the at least one emitter may be reduced compared to conventional under-display emitter structures. Further, if the electromagnetic radiation is light, heating of the display 110 via the light and, hence, an expansion of the display device 110 may be reduced. Therefore, the likelihood of a display damage (e.g. glass fracture) may be reduced.

For example, if the at least one sensor is an optical sensor measuring infrared light (i.e. a wavelength of the light is between approx. 700 nm and approx. 1 mm) from the scene in front of the front side of the display device 110, the at least one emitter may be configured to emit the infrared light for illuminating the scene. In other words, the at least one emitter may be an illumination element (circuitry, device) for illuminating the scene.

In other examples, if the at least one sensor is a radar sensor measuring radio waves from the scene in front of the front side of the display device 110, the at least one emitter may be configured to emit the radio waves for scanning the scene. In other words, the at least one emitter may be a radar transmitter.

In case the at least one sensor is a radio frequency receiver for wireless communication, the at least one emitter may be configured to emit radio waves and act as a radio frequency transmitter for wireless communication.

Generally speaking, any electronic device, which is impaired by the display technology of the second display region 112, may be located behind the first display region 111 with increased transparency.

In some examples, if the at least one sensor is an optical sensor measuring infrared light from the scene in front of the front side of the display device 110, the first display region 111 may comprise at least one further light-emitting element (circuitry, device) configured to emit the infrared light for illuminating the scene. For example, the at least one further light-emitting element may comprise/be a micro LED configured to emit the infrared light. In other examples, the at least one further light-emitting element may comprise a Vertical-Cavity Surface-Emitting Laser (VCSEL) or any other type of laser diode that is configured to emit the infrared light. In other words, the first display region 111 may contain not only RGB pixels, but also one or more infrared (micro) LEDs or infrared VCSELs forming an illumination unit (e.g. if the at least one optical sensor 120 is a ToF sensor). For example, some of the RGB micro LEDs of the first display region 111 may be replaced with infrared (micro) LEDs or infrared VCSELs. Alternatively, the infrared (micro) LEDs or infrared VCSELs may be placed between the RGB micro LEDs of the first display region 111. The driver circuitry for the infrared (micro) LEDs or infrared VCSELs may be integrated in the existing display circuitry for driving the regular e.g. OLEDs or micro LEDs of the display. The at least one further light-emitting element may be configured to selectively emit the infrared light either directly (e.g. by comprising corresponding micro LEDs or VCSELs for the infrared light) or indirectly (e.g. using one or more light conversion elements for converting the light emitted by one or more micro LEDs or VCSELs to infrared light).

The first display region 111 may be a coherent (connected) region of the display device 110 as illustrated in FIG. 1 or comprise a plurality of non-coherent (discontinuous) sub-regions. For example, if the electronic device 110 comprises a plurality of sensors, the plurality of sensors may be arranged on the back side of the display device 110 facing different ones of the plurality of sub-regions. In other words, the plurality of sensors may be arranged on the back side of the display device 110 at positions of different ones of the plurality of sub-regions of the first display region 111.

There may be any number of sub-regions of the first display region 111. Any number of sensors or other electronic devices may be arranged underneath of each of the sub-regions.

The display device 100 may comprise one or more additional display regions using one or more display technologies different from the first and the second display technologies of the first display region 111 and the second display region 112. Transparencies of the one or more additional display regions for the electromagnetic radiation may be different from those of the first display region 111 and the second display region 112. Similarly to what is described above, any number of sensors or other electronic devices may be arranged underneath of each of the additional display regions.

A ratio of the first display region 111's size to the second display region 112's size may be arbitrary. For example, the size of the first display region 111 may be smaller than the size of the second display region 112. However, the proposed technique is not limited thereto.

In the example of FIG. 1, the second display region 112 fully surrounds the first display region 111. In other words, the first display region 111 is fully enclosed by the second display region 112. However, the proposed technique is not limited thereto. The second display region 112 may, e.g., only partially surround the first display region 111 in some examples. For example, if the first display region 111 is arranged at an edge of the electronic device 100's front surface, only part of the first display region 111 may be surrounded by the second display region 112. The other part of the first display region 111 may form the part of the edge of the electronic device 100's front surface.

The first display region 111 exhibits a rectangular shape in the example of FIG. 1. However, the proposed technique is not limited thereto. In general, the first display region 111 and the second display region 112 may be of any target (desired) shape. For example, the first display region 111 may exhibit a circular or an oval shape according to examples of the present disclosure.

In other words, FIG. 1 shows an exemplary device where the main display has a "hole", in which a different technology is used to create an area which is more transparent than the remaining display. Below, optical sensors like cameras and ToF sensors are located.

Although not illustrated in FIG. 1, the electronic device 100 may optionally comprise further circuitry/elements such as, e.g., one or more microphones, one or more loudspeakers, one or more antennas, one or more application processors, one or more radio frequency transmitters and/or receivers for mobile communication, one or more data storages, one or more batteries, etc.

Figure 2:
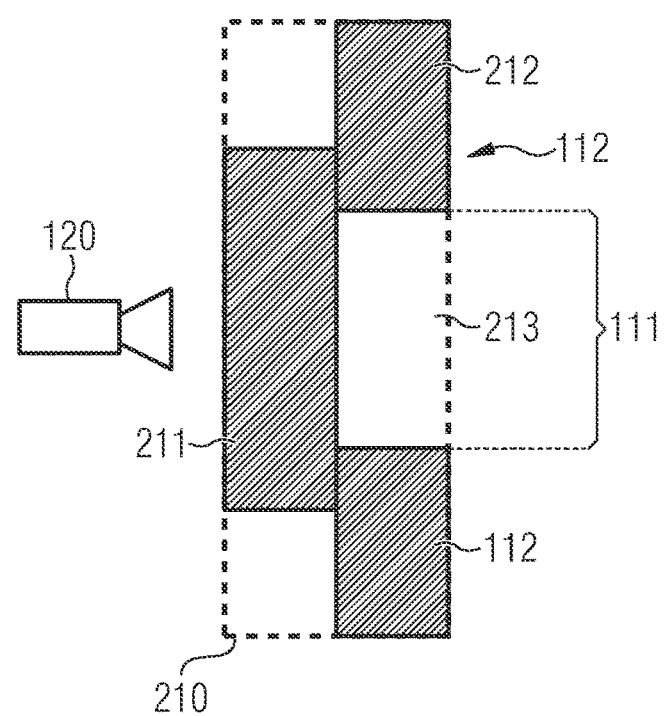
FIG. 2 illustrates an example of a display device.

In the above, it was described that the first display region and the second display region are formed on the same substrate. However, the proposed technique is not limited thereto. In alternative examples, two separate displays may be used. This is shown in FIG. 2 illustrating an alternative display device 210.

The display device 210 comprises a first display 211 using the first display technology and a second display 212 using the second display technology. For example, the first display 211 may be a micro LED display and the second display 212 may be an OLED display. Accordingly, the first display 211 is more transparent for the electromagnetic radiation than the second display 212.

The second display 212 extends over the second display region 112 of the display device 210 similar to what is described above. Further, a recess (notch, gap, opening) 213 is formed in the second display 212 so that the second display 212 does not extend into the first display region 111 of the display device 210. The first display 211 is arranged on a backside of the second display 212 and faces the recess 213. In other words, the first display 211 is arranged on the backside of the second display 212 at a position of the recess 213.

The recess 213 may, e.g., be filled with a transparent material such that the second display 212 is visible.

Each of the first display 211 and the second display 212 is configured to display a respective part of an optical image on its respective front side such that the optical image as a whole is displayed on the front side of the display device 210.

Similar to what is described above, at least one optical sensor 120 is placed behind the first display 211 (faces the first display 211) to make use of the increased transparency of the first display 211.

Using two separate displays 211 and 212 may allow to independently develop the first display 211 and customize it for the underlying sensor(s). Accordingly, the display technology of the second display 212 need not be adapted.

Figure 3:
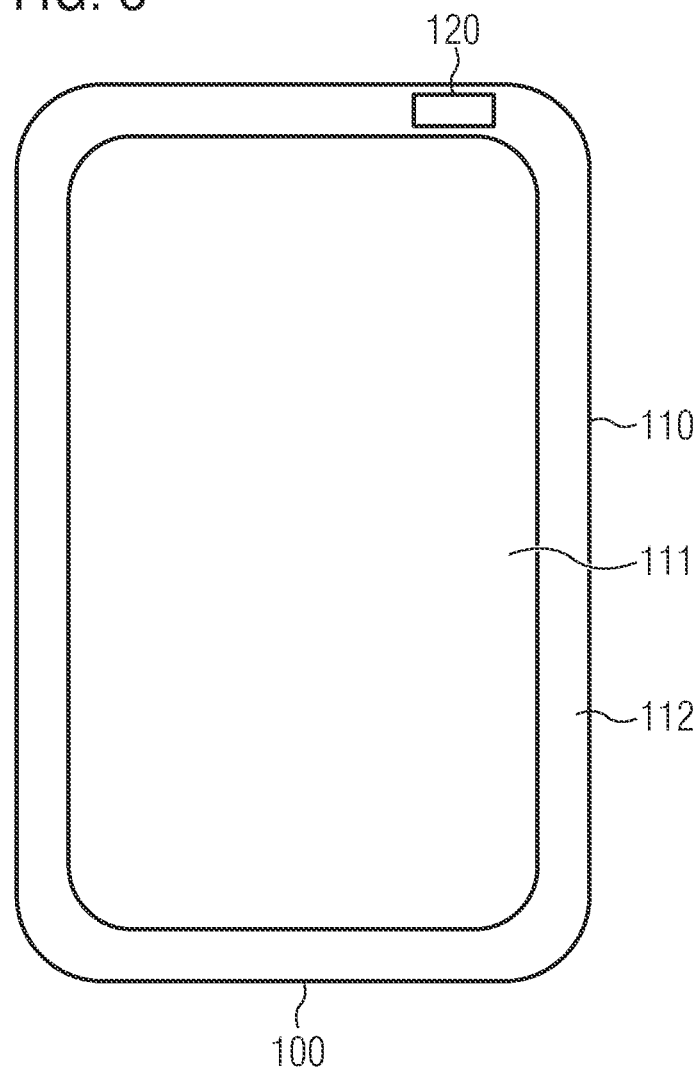
FIG. 3 illustrates another example of an electronic device.

FIG. 3 illustrates a variation of the electronic device 100. While the second display region 112 fully surrounds the first display region 111 in the example of FIG. 1, the first display region 111 fully surrounds the second display region 112 in the example of FIG. 3. Again, the at least one sensor 120 is placed behind the first display region 111 with increased transparency. For example, an illuminated edge around the main display 112 of the electronic device 100 (e.g. a smartphone) may be achieved.

Although not explicitly illustrated in FIG. 3, the first display region 111 may only partially surround the second display region 112 in other examples of the present disclosure. For example, at least part of the second display region 112 may extend up to an edge of the electronic device 100's front surface.

However, similar to what is stated above, the proposed technique is not limited to the shapes of the first display region 111 and the second display region 112 illustrated in FIG. 3. In general, the first display region 111 and the second display region 112 may be of any target (desired) shape.

The examples as described herein may be summarized as follows:

Some examples relate to an electronic device. The electronic device comprises a display device configured to display an optical image on a front side of the display device. Further, the electronic device comprises at least one sensor configured to measure electromagnetic radiation received from a scene in front of the front side of the display device. The display device comprises a first display region using a first display technology and exhibiting a first transmissivity for the electromagnetic radiation. The display device further comprises a second display region using a second display technology and exhibiting a second transmissivity for the electromagnetic radiation. The first transmissivity is higher than the second transmissivity. The at least one sensor is arranged on a back side of the display device and faces the first display region.

In some examples, a pixel density of the first display region is equal to a pixel density of the second display region.

According to some examples, the first display technology uses micro light emitting diodes, and wherein the second display technology uses organic light emitting diodes.

In some examples, the first display region comprises a plurality of first light-emitting elements for displaying a first part of the optical image on the front side of the display device, wherein the second display region comprises a plurality of second light-emitting elements for displaying a second part of the optical image on the front side of the display device.

According to some examples, the first light-emitting elements are of smaller individual size than the second light-emitting elements.

In some examples, distances between neighboring ones of the plurality of second light-emitting elements in the second display region are smaller than distances between neighboring ones of the plurality of first light-emitting elements in the first display region.

According to some examples, a number of the first light-emitting elements per unit area in the first display region is equal to a number of the second light-emitting elements per unit area in the second display region.

In some examples, each of the first light-emitting elements comprises at least one respective micro light emitting diode, wherein each of the second light-emitting elements comprises at least one respective organic light emitting diode.

According to some examples, the display device comprises a third display region, wherein the third display region comprises a mixed arrangement of the first light-emitting elements and the second light-emitting elements.

In some examples, electronic circuitry of the first display region is formed on a same substrate layer of the display device as electronic circuitry of the second display region.

In alternative examples, electronic circuitry of the first display region and electronic circuitry of the second display region are formed on different substrate layers of the display device.

In further alternative examples, the display device comprises a first display using the first display technology and a second display using the second display technology, wherein the second display extends over the second display region, wherein a recess is formed in the second display so that the second display does not extend into the first display region, and wherein the first display is arranged on a backside of the second display and faces the recess.

According to some examples, the electronic device comprises a plurality of sensors, wherein the first display region comprises a plurality of sub-regions, and wherein the plurality of sensors are arranged on the back side of the display device facing different ones of the plurality of sub-regions.

In some examples, the at least one sensor is an optical sensor, and wherein the electromagnetic radiation comprises light.

According to some examples, the at least one sensor is one of a radar sensor and a radio frequency receiver, and wherein the electromagnetic radiation comprises radio waves.

In some examples, the electronic device further comprises at least one emitter configured to emit the electromagnetic radiation, wherein the at least one emitter is arranged on the back side of the display device and faces the first display region.

According to some examples, the electromagnetic radiation comprises infrared light, wherein the first display region comprises at least one light-emitting element configured to emit the infrared light for illuminating the scene.

In some examples, the first display region at least partially surrounds the second display region.

In alternative examples, second display region at least partially surrounds the first display region.

According to some examples, the electronic device is one of a smartphone, a tablet-computer and a laptop-computer.

Examples of the present disclosure may provide display with multiple pixel technologies for under-display sensors. According to examples, a more transparent display technology is selectively used in the area of a (e.g. smartphone) display where optical sensors and illumination units are located. In other words, a solution for the under-display camera problem is proposed that combines, e.g., micro LED displays with another display technology (e.g. OLED or liquid display) in order to generate a camera window for electronic devices like smartphones with good transparency. For example, micro LED displays may allow for increased brightness and smaller pixel sizes of several µm in diameter that may provide increased transparency. Behind the more transparent area of the display, optical or other sensors can be located.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. An electronic device, comprising:
   a display device configured to display an optical image on a front side of the display device; and
   at least one sensor configured to measure electromagnetic radiation received from a scene in front of the front side of the display device,
   wherein the display device comprises a first display region using a first display technology and exhibiting a first transmissivity for the electromagnetic radiation,
   wherein the display device further comprises a second display region using a second display technology and exhibiting a second transmissivity for the electromagnetic radiation, the first transmissivity being higher than the second transmissivity, and
   wherein the at least one sensor is arranged on a back side of the display device behind the first display region and faces the first display region, such that the display device is arranged between the at least one sensor and the scene.

2. The electronic device of claim 1, wherein a pixel density of the first display region is equal to a pixel density of the second display region.

3. The electronic device of claim 1, wherein the first display technology uses micro light emitting diodes, and wherein the second display technology uses organic light emitting diodes.

4. The electronic device of claim 1, wherein the first display region comprises a plurality of first light-emitting elements configured to display a first part of the optical image on the front side of the display device, and wherein the second display region comprises a plurality of second light-emitting elements configured to display a second part of the optical image on the front side of the display device.

5. The electronic device of claim 4, wherein the first light-emitting elements are of smaller individual size than the second light-emitting elements.

6. The electronic device of claim 4, wherein distances between neighboring ones of the second light-emitting elements in the second display region are smaller than distances between neighboring ones of the first light-emitting elements in the first display region.

7. The electronic device of claim 4, wherein a number of the first light-emitting elements per unit area in the first display region is equal to a number of the second light-emitting elements per unit area in the second display region.

8. The electronic device of claim 4, wherein each of the first light-emitting elements comprises at least one respective micro light emitting diode, and wherein each of the second light-emitting elements comprises at least one respective organic light emitting diode.

9. The electronic device of claim 4, wherein the display device comprises a third display region, wherein the third display region comprises a mixed arrangement of the first light-emitting elements and the second light-emitting elements.

10. The electronic device of claim 1, wherein the display device comprises a first display using the first display technology and a second display using the second display technology, wherein the second display extends over the second display region, wherein a recess is formed in the second display so that the second display does not extend into the first display region, and wherein the first display is arranged on a backside of the second display and faces the recess.

11. The electronic device of claim 1, wherein the electronic device comprises a plurality of sensors, wherein the first display region comprises a plurality of sub-regions, and wherein the plurality of sensors is arranged on the back side of the display device facing different ones of the plurality of sub-regions.

12. The electronic device of claim 1, wherein the at least one sensor is an optical sensor, and wherein the electromagnetic radiation comprises light.

13. The electronic device of claim 1, wherein the at least one sensor is one of a radar sensor and a radio frequency receiver, and wherein the electromagnetic radiation comprises radio waves.

14. The electronic device of claim 1, further comprising at least one emitter configured to emit the electromagnetic radiation, wherein the at least one emitter is arranged on the back side of the display device and faces the first display region.

15. The electronic device of claim 1, wherein the electromagnetic radiation comprises infrared light, and wherein the first display region comprises at least one light-emitting element configured to emit the infrared light for illuminating the scene.

16. The electronic device of claim 1, wherein the at least one sensor is a Time-of-Flight (ToF) sensor.

17. The electronic device of claim 1, wherein the first display region and the second display region are formed on separate substrates.

18. An electronic device, comprising:
a display device configured to display an optical image on a front side of the display device; and
at least one sensor configured to measure electromagnetic radiation received from a scene in front of the front side of the display device,
wherein the display device comprises a first display using a first display technology,
wherein the display device further comprises a second display using a second display technology,
wherein the first display is more transparent for electromagnetic radiation than the second display,
wherein the first display and the second display are separate displays,
wherein a recess is formed in the second display,
wherein the first display is arranged on a backside of the second display and faces the recess,
wherein the at least one sensor is arranged behind the first display and faces the first display.

19. The electronic device of claim 18, wherein the recess is filled with a transparent material.

* * * * *